(12) United States Patent
Wheeler et al.

(10) Patent No.: US 7,496,823 B2
(45) Date of Patent: Feb. 24, 2009

(54) HARDWARE BASED MEMORY SCRUBBING

(75) Inventors: Andrew Ray Wheeler, Fort Collins, CO (US); James R. Peterson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 567 days.

(21) Appl. No.: 11/081,335

(22) Filed: Mar. 16, 2005

(65) Prior Publication Data

US 2006/0212778 A1 Sep. 21, 2006

(51) Int. Cl.
*G11C 29/00* (2006.01)
(52) U.S. Cl. ...................................... 714/764
(58) Field of Classification Search ................. 714/764, 714/723
See application file for complete search history.

(56) References Cited

U.S. PATENT DOCUMENTS

| | | | |
|---|---|---|---|
| 4,479,214 A * | 10/1984 | Ryan | 714/702 |
| 5,410,545 A * | 4/1995 | Porter et al. | 714/723 |
| 5,588,112 A | 12/1996 | Dearth et al. | |
| 6,101,614 A | 8/2000 | Gonzales et al. | |
| 6,292,869 B1 | 9/2001 | Gerchman et al. | |
| 6,832,340 B2 | 12/2004 | Larson et al. | |
| 6,845,472 B2 | 1/2005 | Walker et al. | |
| 7,137,038 B2 * | 11/2006 | New et al. | 714/42 |
| 7,246,269 B1 * | 7/2007 | Hamilton | 714/42 |
| 2005/0028039 A1 | 2/2005 | Henderson et al | |

OTHER PUBLICATIONS

R.B. Tremaine, et al., "IBM Memory Expansion Technology (MXT)", IBM J. Res & Dev. vol. 45 No. 2, Mar. 2001, pp. 271-285.

* cited by examiner

*Primary Examiner*—Guy J Lamarre (57) ABSTRACT

This application relates to hardware based memory scrubbing. One disclosed embodiment may comprise a system that includes an engine, implemented in hardware, configured to initiate a request for data residing in associated memory. An error system is configured to detect errors in data that has been read from associated memory in response to the request for the data, the error system maintaining a log of entries corresponding to errors detected by the error system. An identifier is associated with each of the entries in the log that result from the request initiated by the engine to differentiate from other entries in the log.

17 Claims, 5 Drawing Sheets

HARDWARE BASED MEMORY SCRUBBING

BACKGROUND

Computer systems employ semiconductor memory devices, such as dynamic random access memory (DRAM) to store blocks of data. Such semiconductor memory devices are susceptible to errors. The errors can generally be classified as "hard errors" or "soft errors". Hard errors are typically reoccurring errors that often require hardware correction and tend to be uncorrectable. Soft errors generally correspond to transient events and are not generally repeatable.

DETAILED DESCRIPTION

Figure 1:
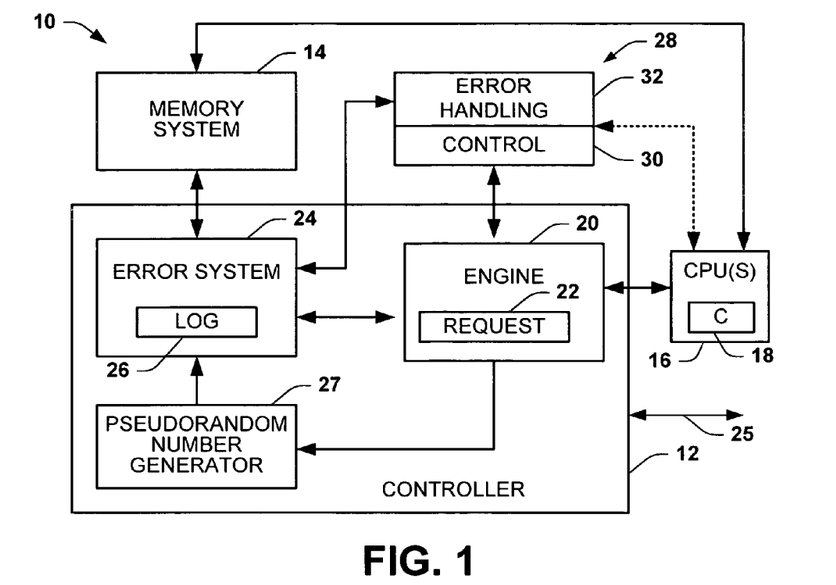
FIG. 1 depicts an embodiment of a system for hardware based scrub memory scrubbing.

FIG. 1 depicts an example of a computer system 10 implementing hardware based memory scrubbing. As used herein, the term "scrubbing" generally refers to a hardware-implemented process of detecting and correcting correctable errors in a memory system. The errors can include soft (or transient) errors as well as, in certain circumstances, hard errors.

The computer system 10 includes a controller 12 that is configured to implement scrubbing of an associated memory system 14. The controller 12, for example, can be implemented as an integrated circuit chip, such as corresponding to an input/output (I/O) controller or other circuitry of the computer system 10. For example, the controller 12 can include one or more ports through which requests and responses can be communicated relative to other components (not shown) in the computer system 10. The controller 12 can also communicate requests and responses with one or more central processing units (CPU(S)) 16 of the computer system 10, such as for snooping cache memory 18 of the one or more CPU(S). That is, by implementing the controller 12 as an I/O controller, proactive scrubbing of the memory system 14 can be facilitated, including scrubbing of code or data also residing in the cache memory 18.

The controller 12 includes an engine 20 configured to implement proactive scrubbing of the memory system 14. The engine 20 is operative to initiate a request 22 for data from the memory system 14. The request 22, for instance, includes an address for one or more lines of data (e.g., corresponding to one or more cache lines) as well as an identifier that the request is being initiated by the engine 20. The particular information contained in the request can vary according to the type of cache coherency protocol (or protocols) being implemented in the computer system 10. The request 22 can be passed to the memory system 14 as well as to the one or more CPU(S) 16 for passing the request to the cache memory 18 of the one or more CPU(S).

Additionally, by implementing the engine 20 as part of an I/O controller, the engine can operate in the coherency domain of the computer system 10. That is, the engine 20 can be implemented as a direct memory access engine that includes the logic necessary to provide a direct memory access capability to data stored in the memory system 14, including data that may also be stored in the cache 18 of the one or more CPU(S) 16. Accordingly, lines of data within a programmable address range may be scrubbed regardless of whether the data resides in the cache 18, the memory system 14, or in some transient state between cache and main memory. The engine 20 thus can implement scrubbing so that the coherency of data in the computer system 10 is maintained.

The memory system 14 can be any arrangement or type of solid state memory implemented in the computer system 10. As an example the memory system 14 can include random access memory (e.g., static RAM (SRAM), dynamic RAM (DRAM)), programmable ROM (e.g., FLASH memory), as well as any hierarchy of memory that may be associated with the memory system, which may or may not include a level of cache memory. The quantity, configuration and type of memory that is employed to form the memory system 14 can vary according to the type and configuration of the computer system 10 and performance requirements. The memory system 14 also includes a memory controller (not shown) for controlling access to memory locations in the memory system 14.

The controller 12 also includes an error system 24 that performs error detection relative to the data in the memory system 14 for the data block identified by the request 22. The error system 24 can also be configured to implement error correction to correct correctable errors that are detected. As part of the controller 12, the error system 24 can also implement error detection for data requests initiated by other requesters (not shown). For instance, data requests can be provided internally from other components (not shown) within the controller 12, such as one or more components having direct access to the memory system 14. Data requests can also be provided to the controller 12 from system components located external to the controller, such as via controller I/O ports 25.

The error system 24 can populate a log 26 in response to detecting an error in the memory system 14. For example, the log 26 can be in the form of a data structure that resides in a register or other memory device (e.g., RAM or cache). The log 26 can include data that characterizes the memory location of the detected error. The characterization can also include an agent identifier that provides a means for differentiating between errors resulting from a request that is sourced by the engine 20 and errors resulting from requests from other sources. The agent identifier can include an indication of the type of the agent making the request as well as/or as an alternative a specific identifier for the requesting agent. The agent identifier can also enable firmware 28 to uniquely identify which errors in the log 26 resulted from requests initiated by the engine 20. The data in the log 26 further can include an identification of the type or severity of error along with information identifying a location in the memory system 14 where the error occurred. As an example, the location information can include a range of one or more lines of memory (e.g., a memory page) as well as identification on which memory module the error occurred. The memory module may be any type or configuration of memory, such as for example, dual in line memory module (DIMM) or single in line memory module (SIMM), and auxiliary memory in the computer system 10, to name a few.

The error system 24 can also signal error handling control (e.g., running on a service processor or CPU) that an error has occurred. The information can include some or all of the information that is stored in the error log. For instance, the error system can implement the signal via an interrupt transaction or dedicated interrupt line or other direct communication mechanism (e.g., substantially in real time).

The controller 12 can also include a pseudorandom number generator 27. The engine 20 can control the pseudorandom number generator 27 according to the operating mode of the engine. The pseudorandom number generator 27 generates a pseudorandom number value that can be utilized to test and initialize the memory system 14. For example, during a test and initialization mode (e.g., during bootstrap), the engine 20 can cause the pseudorandom number generator 27 to generate random values. The random values can be written to the memory system 14 and read from corresponding address locations to detect errors, which can be correctable or uncorrectable errors. The corresponding address locations tested during this phase can be one or more address ranges, as identified by the engine 20. The one or more ranges that are tested can be set by firmware 28. The errors detected during the testing mode can be reported to the engine 20 as well as maintained in the log 26 of the error system 24. Additionally, the errors can be signaled to the firmware 28 for use in mapping the memory system 14 and deallocating from the system 10 selected portions of memory that exhibit hard errors or that is otherwise determined to be corruptible.

The firmware 28 can be configured to control the engine 20 to implement scrubbing of the memory system 14. The firmware 28 can run on a microcontroller or processor (e.g., a dedicated service processor), such as may be implemented within the controller 12 or be external and in communication with the controller via an interface. Alternatively, the firmware 28 can run as threads on one of the CPU(S) 16. The firmware 28 can be implemented as instructions or code that is stored in read-only memory (ROM), which may be programmable (e.g., programmable ROM).

The firmware 28 includes a control thread (or core) 30 that controls and manages operation of the engine 20. The control thread 30 can be employed to set the operating mode of the engine 20 as well as to define other operating parameters for the engine 20, which parameters can vary according to the operating mode. The operating parameters may include one or more addresses ranges of the memory system 14 that are to be scrubbed as well as controlling a rate (or scrub cycle) at which the scrubbing is implemented during the normal or scrubbing mode.

By way of example, the control thread 30 can operate the engine 20 in a first operating mode, such as corresponding to a test and initialization mode. The firmware 28 can initiate the test and initialization mode during a reset or boot process. For instance, an early turn-on mode or other mode that occurs during boostrap can be utilized to activate the engine 20 to test and initialize the memory system 14 before releasing the CPU(s) from reset. In the first operating mode, the engine 20 can employ the pseudorandom number generator 27 and the error system 24 to test the contents of the memory system 14 with pseudorandom data. The extent and range of memory locations tested during this mode can be programmable via the firmware 28. While the control thread 30 manages the engine 20 during the test and initialization mode, one or more other threads/cores (not shown) of the firmware 28 can control the controller to perform I/O discovery and other relevant tasks.

The firmware 28 can also include an error handling thread (or core) 32. The error handling thread 32 can monitor errors detected by the error system 24 and take appropriate action, which can vary according to the operating mode and the type of errors detected. During the first operating mode, the error handling thread 32 can deallocate corruptible portions of the memory system. Corruptible portions of the memory system 14 can correspond to catastrophic errors within the memory system 14 as well as portions of the memory system (e.g., DIMMs) that have been determined to be unreliable. The unreliability can be determined based on ascertaining an error characteristic for a given portion of the memory system 14. For instance, the error characteristics can include an indication of the type of error (e.g., correctable or uncorrectable) as well as an error rate at which soft errors occur for a particular portion of the memory system 14. The error rate can be presented as a mean time between failures (MTBF) of whatever portion of the memory system (e.g., DIMM) that is under consideration.

The error handling thread 32 can deallocate corruptible portions of the memory system by writing to a deallocation table (not shown). The deallocation table can be implemented as a data structure, which can reside in an interface between the operating system and the firmware 28. Since firmware has access to the deallocation table, the control thread 30 can also employ the deallocation table during other modes.

By way of further example, the control thread 30 can also operate the engine 20 in a second operating mode, such as corresponding to a normal operation and scrub mode. In the normal operation and scrub mode, the control thread 30 can set a scrubbing interval or cycle, which can be fixed or variable during the normal operation and scrub mode. The control thread 30 can also establish one or more ranges of addresses in the memory system 14 for which scrubbing is to be implemented by the engine 20 during a scrubbing cycle. The address ranges can be stored in a corresponding register or other memory device employed by the firmware 28. The address range data in the firmware can also be used to program a corresponding data structure in the engine 20. In the normal operation and scrub mode, the engine 20 initiates requests 22 for data within the specified memory range. As mentioned herein, the requests 22 can be sent to the memory system 14 and to cache 18 of the CPU(S) 16.

The error system 24 determines whether an error exists at the memory system 14. The error system 24 can also determine whether a detected error is a correctable error type or an uncorrectable error type. Those skilled in the art will understand and appreciate various types of correctable and uncorrectable errors that can be detected and differentiated based upon an error detection algorithm being implemented by the error system 24. Information about the errors can be stored in the log 22, such as information described herein.

The error handling thread 32 of the firmware 28 can monitor error history that includes information maintained in the log 22. The error history monitored by the error handling thread 32 can include one or more scrub cycles to enable error handling to proceed in a desired manner.

For example, the error thread 32 can implement an algorithm that detects and determines whether a specified address range includes an uncorrectable error. An uncorrectable error can include errors specified by the error system 24 (e.g., stored in the log 22) as being uncorrectable. Additionally or alternatively, an uncorrectable error can correspond to a soft error at a corruptible portion of the memory system 14, which can be determined based on a correctable error occurring at or above a predetermined frequency. The errors may be occurring at the same memory address or the errors may be occurring at different addresses within the same memory page. The particular algorithm that is utilized to determine errors as being correctable or uncorrectable can be programmed into the firmware 28.

The error handling thread 32 also controls what action is performed in response to detecting an uncorrectable error. Different actions may be desired for requests initiated by the engine 20 during the normal operation and scrub mode. Accordingly, the error handling thread 32 can control the action based on the agent identifier associated with the request that resulted in the uncorrectable error. For example, the error handling thread 32 can withhold loss or disruption of service in the computer system when a normally fatal (or non-recoverable) error is detected in response to a request from the engine 20 during the normal operation and scrub mode. The corresponding portion of memory system 14 where the uncorrectable error is detected can be deallocated, which is useful when the uncorrectable error is detected in memory that is not presently being used. Additionally or alternatively, the algorithm implemented by the error handling thread 32 can be programmed to deallocate memory proactively if it is determined that the number or frequency of errors in a particular region (e.g., a page or DIMM) of the memory system 14 is increasing over time.

In view of the foregoing, it is to be appreciated that the hardware-based memory scrubbing mitigates various problems in the computer system 10 that might occur if errors were left unscrubbed. For example, an uncorrected transient error for a given memory location can be discovered and reported multiple times. Repeated reports of the error from the same location in memory may be mistaken for a hard (non-transient) error, leading management firmware and/or the operating system to conclude that a working memory module is broken. By way of further example, if the uncorrected transient error is in a heavily used line of the memory system 14, the operating system and/or firmware may spend excessive amounts of time in error-handling interrupt service routine (ISR) code, as the error gets re-discovered and re-reported rapidly. In extreme cases, this could prevent the one or more CPU(S) from making forward progress. If a transient correctable error is left uncleaned for an extended period of time, one or more additional transient errors may occur in the same line of physical memory. The successive transient errors might result in a multiple-bit error in the line of physical memory, which tends to cause a system crash when the line of data is accessed.

Figure 2:
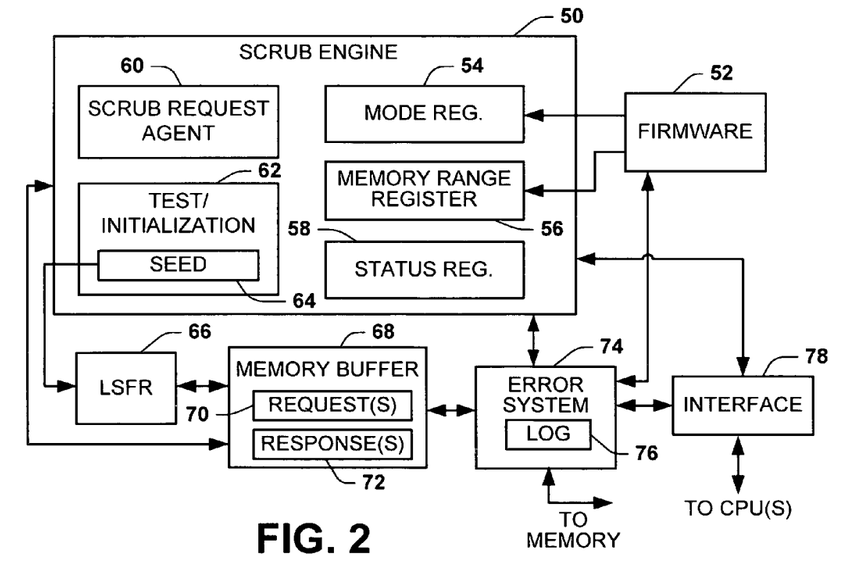
FIG. 2 depicts an embodiment of a scrub engine in the context of a computer system.

FIG. 2 depicts an example of a scrub engine 50 that can be implemented in a computer system. Other portions of a computer system are shown in FIG. 2 for purposes of demonstrating an example of an environment for the scrub engine 50. As described herein, the scrub engine 50 is implemented as hardware, such as circuitry of an I/O controller or other hardware.

The scrub engine 50 includes one or more registers that can be programmed by associated firmware 52 to control the scrub engine. In the example FIG. 2, the scrub engine 50 includes a mode register 54 that controls the operating mode of the scrub engine. The firmware 52 can set a value for the mode register 54 according to the operating mode of the computer system. For example, the firmware 52 can set the mode register 54 to operate the scrub engine 50 in two or more operating modes, including an initialization and test mode (e.g. as occurs during boot strap for the computer system) and a normal mode during run time (e.g., while the operating system and applications are running). For example, the scrub engine 50 can include a state machine or microcontroller or processor that controls operation and implements selected functions according to the value stored in the mode register 54.

The firmware 52 can also program a memory range register 56 of the scrub engine. The memory range register 56 can be programmed to include a range of one or more addresses for data in associated memory (not shown) that is to be cleansed or tested by the scrub engine 50. The associated memory corresponds to main memory that includes a memory controller for receiving and processing requests and other commands for accessing data. For example, the memory range register 56 can identify a range of one or more data lines (e.g., cache lines), such as memory pages comprising a plurality of data lines. The scrub engine 50 can also include a status register 58 to identify the status of a current operation that is being implemented by the scrub engine. The status register 58 can also be monitored by the firmware 52 to ascertain whether a particular phase has been completed. Thus, the firmware 52 can update one or both of the mode register 54 and the memory range register 56 as a function of the values provided in the status register 58.

The scrub engine 50 can include a scrub request agent 60 that is utilized to generate requests to memory locations in the computer system. A request, for example, can correspond to a read request for data residing in the main memory as well as in caches associated with one or more CPU(s). The scrub engine 50 can also include a test/initialization circuitry 62 that is utilized during a test and initialization mode for testing and initializing the main memory. The test and initialization circuitry 62 can also be utilized to set error correction codes of an associated error system 74 to enable error correction of data stored in the memory. The test/initialization circuitry 62 also can include a seed value 64 that is utilized to seed a pseudorandom number generator, such as including a linear shift feedback register (LSFR) 66 depicted in FIG. 2. The seed value can be programmed, such as by the firmware 52. The LSFR 66 generates a pseudorandom value that is utilized to test the main memory during the test and initialization mode. For example, the pseudorandom value can be written to and read from selected memory locations for determining if correctable or uncorrectable errors may exist in the main memory.

A memory buffer 68 can be utilized to store data that is being processed by the scrub engine 50. The memory buffer 68 can store request data 70 as well as response data 72. The information and content of the request data 70 and response data 72 in the memory buffer 68 can depend on the operating mode of the scrub engine 50 (e.g., as set in the mode register 54). An error system 74 sends requests from the request data 70 of the memory buffer 68 to associated main memory via an associated memory interface (not shown). The error system 74 can also load responses to requests into as response data 72 of the memory buffer 68. The error system can also communicate requests and responses with one or more CPU(s) of the computer system via a corresponding interface 78.

The error system 74 also includes a log 76 for storing error data in response to detecting errors in the memory. The error system 74 is configured to detect errors by implementing error detection logic. The error system 74 may also be configured to correct errors that are deemed correctable. The error system 74, for example, can be implemented as error correction circuitry (ECC) within the same integrated circuit as the scrub engine 50. Various types and configurations of ECC can be utilized in combination with the scrub engine 50 to implement the functions described herein.

As an example, the test/initialization circuitry 62 can test memory during the test and initialization mode for a test range of addresses, as provided in the memory range register 56. The pseudorandom value generated by the LSFR 66 can be written to memory locations defined by the test range, while the ECC correction of the error detection block 74 is disabled. The same or different pseudorandom values can be utilized for different memory locations in the test range. The ECC of the error system 74 can be disabled by the scrub engine 50 during a first phase of the test and initialization mode. The phase of the test and initialization mode can be determined based on the value in the mode register.

After the pseudorandom value has been written to a given address in the test range, the ECC algorithm implemented by the error system can include the following:

(i) Read pattern from memory location and compare to re-generated LSFR data pattern.
(ii) Write inverse of the LSFR data pattern back to the memory location with the ECC correction enabled.
(iii) Read the inverse pattern from the memory location and compare such pattern to the re-generated LSFR data pattern.

Those skilled in the art will understand and appreciate other types and variations of algorithms that can be implemented in the hardware to implement corresponding test and initialization of memory. By implementing such an algorithm in the scrub engine 50, such as part of the I/O controller, the system boot time can be reduced and the electrical characterization of the memory subsystem can be facilitated. The reduction in boot time will generally depend on the amount of memory in the computer system and the exhaustiveness the testing process. For example, there would be a significant decrease in boot time between a software-based memory test and initialization process for the memory system containing equal to or greater than about 1 terabyte of memory. Significant decreases in boot time can also be realized for smaller memory systems.

The scrub engine 50 can also operate in a normal mode, such as in response to the firmware 52 setting the mode register to a value corresponding to a normal operating mode (e.g., when operating system and applications are running). In the normal mode, the firmware 52 controls the scrub engine 50 to scrub memory proactively, meaning that the scrubbing does not only occur in response to detecting an error. The firmware 52 thus controls the scrub engine 50 to scrub the memory according to a scrub cycle (or interval). The scrub cycle can be fixed or it can be variable, such as may be adjusted based on the extent of correctable and uncorrectable errors. The scrub request agent 60 thus prepares and sends out requests (e.g., read requests) for data based on information in the memory range register 58. The status register can be updated to track progress in a given scrub cycle.

The memory range register 56 can include information that identifies address locations for the entire system memory or it can identify a subset of the system memory for scrubbing, as established by the firmware 52. The address locations being scrubbed can be fixed or the locations can be modified during normal operation (e.g., adjusted for each scrub cycle), such as based on selected memory locations being deallocated during normal operation. As described herein, memory locations can be deallocated in response to detecting an uncorrectable error or the firmware or operating system otherwise removing certain memory locations from the scrubbing process. The error system 74 populates the log 76 in response to detecting errors, which can include parameters that identify correctable errors, uncorrectable errors or both correctable and uncorrectable errors. The information in the log can include information that distinguishes between errors that occur during proactive scrubbing (in response to requests initiated by the scrub engine) and other errors (in response to requests from a source other than the scrub engine). Each entry in the log 76 thus can include an identifier to differentiate between errors resulting from requests initiated by the scrub engine 50 and other requests. The identifier, for example, can uniquely identify errors resulting from requests initiated by the scrub engine 50.

Proactive scrubbing implemented by the scrub engine 50 helps to ensure an upper bound (e.g., determined by the scrub cycle) on how long transient errors can remain in any system memory location. This can be contrasted with purely reactive scrubbing which does not afford an upper bound on transient errors since the errors would be detected and, if possible, corrected in reaction to detecting a correctable error in memory. It is to be understood that the proactive scrubbing implemented by the scrub engine 50 can be implemented as an added feature on an existing reactive scrubbing platform or it can be implemented in the absence of reactive scrubbing.

Additionally, by implementing the scrub engine 50 in an I/O controller or other hardware, the proactive scrubbing that occurs during normal operation as well as the memory test and initialization performed by the scrub engine can be operating system independent. Consequently, operating system upgrades can be implemented without regard to the memory scrubbing scheme. Additionally, the hardware based scrubbing is transparent across different operating systems, such that it can be easily implemented in computer systems that employ multiple operating systems. Furthermore, such a hardware based scrubbing and test and initialization approach enables the scrubbing of memory locations that are typically hard to reach, including unpageable memory (e.g., blocked by the operating system) or code/data that remains resident in a system cache for long periods of time.

Figure 3:
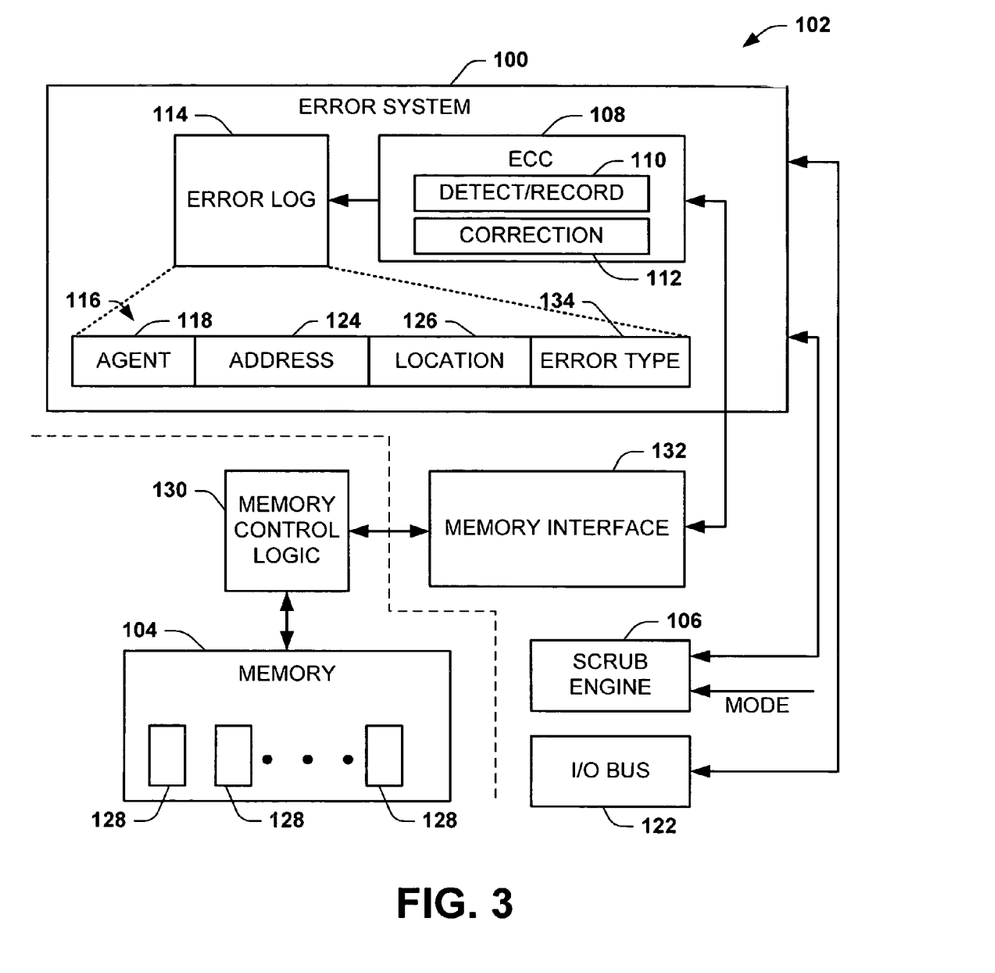
FIG. 3 depicts an embodiment of an error system that can be utilized for implementing hardware based scrubbing.

FIG. 3 depicts an example of an error system 100. Other portions of a computer system 102 are shown in FIG. 3 for purposes of demonstrating an example of an environment for the error system 100 that may be utilized in hardware based scrubbing of memory 104. As described herein, a scrub engine 106 can include a normal scrubbing mode that can be controlled (e.g., by firmware) to implement intermittent or periodic scrubbing of the memory 104. Additionally, the scrubbing engine 106 can include a test and initialization mode that can be implemented at bootstrap, such as described herein.

The error system 100 includes error correction circuitry (ECC) 108. The ECC 108 can include detect/record circuitry 110. In some implementations, the ECC 108 can also include correction circuitry 112. The ECC 108, including the correction circuitry 112 and the detection/record circuitry 110, can be configured based on predetermined codes for testing the accuracy of data as it passes into and out of the memory 104. The codes can be configured as a function of the type and content of the memory 104.

The detect/record circuitry 108 can be configured to detect errors in the memory 104. For example, the correction circuitry 112 can employ an error correction algorithm to provide accurate response data in circumstances when the data read from the memory 104 may include one or more correctable error. For instance, the correction circuitry 112 can be configured to correct single bit or multiple bit errors. The detect/record circuitry 110 may determine the type of error detected for a given line of data, such as being a transient (e.g., correctable) error or it may characterize the error as being a hard (e.g., uncorrectable) error. Corresponding error information can be recorded in an error log 114 in response to detecting an error in data accessed from the memory 104.

The error log 114 can be implemented as a data structure that includes an entry 116 for each error detected by the detect/record circuitry 110. Each entry 116 in the log 114 can include a first field (AGENT) 118 that identifies the agent making the request. The first field 118 provides means that enables firmware or other system components to differentiate between errors detected during proactive scrubbing and errors that occur in response to requests initiated by other sources. For example, the agent can be the scrub engine 106. Alternatively, the agent may correspond to another device with direct memory access. The other device can include hardware in the controller that services requests for accessing the memory 104 such as may be initiated by one or more I/O devices coupled to the system 102. The I/O devices can communicate requests to the memory 104.

The entry 116 in the error log 114 can also include an address field 124 containing data, such as corresponding to a physical address 124 in the memory 104 where the error was detected. The entry 116 can also include a location field 126 that indicates the location (e.g., identifying which module 128 in the memory 104) where the error was detected. For instance, the memory 104 may comprise one or more of memory modules 128. Each of the modules 128 may be implemented as a DIMM. Each module 128 further can include a plurality of memory devices, such as DRAMS on a corresponding substrate. Memory control logic 130 is associated with the memory 110 for routing requests and responses between the modules 128 of the memory 104 and a memory interface 132. The memory interface 132 is depicted as being communicatively coupled between the error system 100 and the memory control logic 130. The memory interface 132 can be part of the integrated hardware (e.g., an IC or circuit board containing a plurality of ICs) that includes the error system 100 and the scrub engine. A dashed line represents a chipset boundary for a memory subsystem that includes the memory control logic and the memory 104.

Each entry 116 in the error log 114 can also include a type field 134 that indicates the category of error indicated at an error type field. The error type field 134, for example, can identify whether the error is a correctable type of error or an uncorrectable type of error as well as a fatal error. The required number of bits for each of the respective fields can vary depending on the level of granularity and the size of the memory system 104. An entry 116 in the error log 114 is not required to include all the fields nor is it limited to the fields described herein. For example, the error log 114 can also store a portion of the data in its corrected state, uncorrected state or both corrected and uncorrected states. Additionally, while the ECC 100 is depicted in FIG. 3 as a single block, it is to be understood that a plurality of ECC units can be implemented, such as with different ECC units performing error detection and correction relative to a selected subsets of the memory 104.

Figure 4:
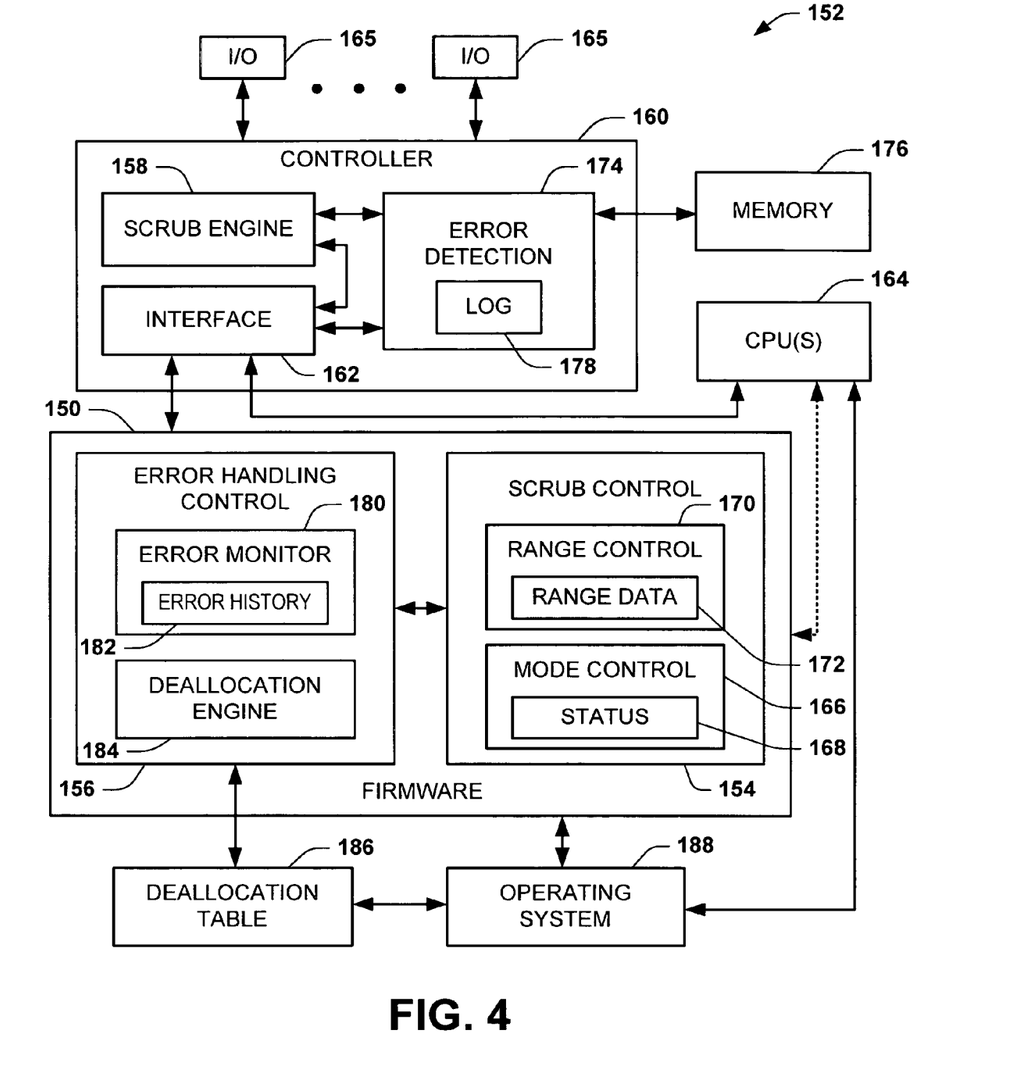
FIG. 4 depicts an embodiment of firmware that can be utilized for implementing hardware based scrubbing.

FIG. 4 depicts an example of relevant firmware 150, in the context of a computer system 152, for implementing hardware based memory scrubbing. The firmware 150 includes scrub control 154 and error handling control 156. The scrub control 154 and error handling control 154 can be considered threads or cores of the firmware 150, such as may be executed by a microcontroller or service processor or system CPU. The scrub control 154 is utilized to control operation of a scrub engine 158 located in an associated controller 160. The controller 160 can communicate with the firmware through an interface 162. The interface 162 can also provide an interface to one or more CPUs 164 of the computer system 152 as well as directly to a microcontroller, state machine service processor or other hardware on which the firmware 150 is running. The controller 160 can be an I/O controller of the computer system 152, such as may communicate with one or more I/O devices 165.

The scrub control 154 includes a mode control function 166 that controls the operating mode of the scrub engine 158. As an example, the mode control 166 can control the scrub engine 158 in a plurality of operating modes including, for example, including a test and initialization mode and a normal operating mode. The mode control 166 can also include status information 168 associated with the scrub engine 158. The status information 168 can be updated by information communicated via the interface 162. The updates can be signaled from the controller 160 or be updated by the firmware 150 polling or otherwise pulling data from the controller. The status information 168, for example, can include a value that identifies the status of the operation that is being implemented by the scrub engine 158. A two bit example of status information for proactive scrubbing that can be utilized is as follows:

00=an idle state;
    01=scrub operation in progress;
    10=can be reserved; and
    11=scrub operation complete.

The operation of the scrub engine 158 further can be controlled by range control 170. The range control 170 includes range data 172 that defines one or more address ranges on which the scrub engine 158 is to operate. The range data 172 can be implemented as a table or other data structure that contains the addresses of the memory 176 that is to be accessed. The range data 172 can be provided in whole or in part to the scrub engine 158 via the interface 162 to implement a given scrub cycle. The range data 172 can vary as a function of the operating mode of the scrub engine 158. As an example, in the test and initialization mode, the range data is set to predetermined values based on which the scrub engine 158 employs the range data to walk through the memory 176 as part of the testing and initialization process implemented by the scrub engine. The firmware 150 can be programmed to test a predetermined portion of the memory 176 up to the entire range of possible memory addresses in the memory 176. The duration of the memory testing thus will depend on the extent of the memory that is tested and the algorithm employed to test the memory. Thus, a less exhaustive set of memory addresses and/or scaled back test algorithm can be employed to reduce boot time.

As described herein, the controller 160 includes an error detection and correction circuit 174 that is operative to detect and correct errors in the memory 176. For example, the error detection and correction circuit 174 can be configured to detect and correct single bit errors as well as multi bit errors depending upon the implementation of such circuitry. The error detection and correction circuit 174 further can maintain a log 178 of such errors that are detected, such as in a buffer, register or other memory device. The log 178 includes an entry that identifies parameters associated with each detected error (See, e.g., FIG. 3). Additionally, the error detection and correction circuit 174 can also signal error handling controls directly (e.g., via an interrupt or other similar means), such as described herein.

As a further example, the range control 170 and mode control 166 can control the scrub engine 158, during a normal operating mode, to proactively scrub one or more selected address ranges in the memory 176. The range data 172 during the normal operating mode contains the addresses of the memory 176 on which proactive scrubbing is to be performed. Where the controller 160 corresponds to an I/O controller, which is in the coherency domain of the computer system 152, the range data 172 can include addresses for "hard to reach" memory locations. The hard to reach memory locations can include unpageable memory or code data that remains resident in cache of the CPU(s) 164 for long periods of time.

The error handling control 156 includes an error monitor 180 that is operative to monitor the log 178. The error monitor 180 can collect data from the log 178 to provide an error history 182 for the memory subsystem. The error history 182 can correspond to a data structure that describes historical parameters of errors in the memory 176. The historical parameters can encompass errors that may occur during any number of one or more scrub cycles. The historical parameters can further characterize the error parameters over a plurality of scrub cycles, such as to ascertain a likelihood that a failure might result. Alternatively or additionally, a deallocation engine 184 can analyze the error history to further characterize portions of the memory 176, such as being corruptible.

As an example, the deallocation engine 184 can employ the error history 182 to determine whether to deallocate portions of the memory 176. The error handling control 156 can selectively modify (e.g., update) a data structure, indicated at a deallocation table 186, based on the error history 182. The deallocation engine 184 thus can deallocate portions of the memory 176, such as a collection of one or more data lines. The granularity at which memory can be deallocated can depend on a variety of factors, including performance requirements and cost. For example, memory locations can be deallocated from the system 152 in a form of a memory page, although other divisions of the memory 176 may be used.

The deallocation engine 184 can write to the deallocation table during the test and initialization mode, as described herein, as well as during normal operation in response to detecting errors. The deallocation engine 184 can deallocate memory that is determined to be uncorrectable. The deallocation engine 184 can also be utilized to proactively deallocate corruptible portions of the memory 176 where it is determined that a known portion of the memory 176 is likely to become uncorrectable, such as by monitoring a plurality of correctable errors in an address range over a predetermined time period. The deallocation engine identifies the portion of memories that are to be deallocated from the computer system 152 and updates the deallocation table accordingly.

The deallocation table 186 can be located at an interface between the firmware 150 and one or more operating systems 188 implemented in the computer system 152. The firmware 150 can also update the range data 172 as a function of the entries in the deallocation table 186. For example, the range data 172 can be implemented to exclude portions of the memory 176, which may correspond to uncorrectable errors or other areas that may have been specifically deallocated by the operating system 188 or by the firmware 150.

The error handling control 156, including the deallocation engine 184, can also control what action to take based upon information in the error history 182. As described herein, the error history 182 obtains information from the error log 178 generated by the error detection and correction logic 174. The error log 178 can include an agent identifier, which enables the error handling control to differentiate between errors detected during proactive scrubbing (by the scrub engine 158) and errors resulting from other requests or access to data in the memory 176. The scrub engine 158 can include one or more unique agent identifiers that are stored in the entry in the log 178 associated with corresponding errors. Since the agent identifier provides a means of differentiating between errors detected during proactive scrubbing and other errors, the firmware 150 can maintain control of what action, if any, is to be performed in response to detecting one or more errors during proactive scrubbing.

By way of further example, when such a system crash may be unwarranted and provided that the memory area is not in use, the deallocation engine 184 can deallocate the portion of memory 176 by updating the allocation table accordingly. Thus, it is to be appreciated that by adding the agent identifier, which can correspond to one or more mode bits, signaling of errors uncovered by the scrub engine 158 can be utilized to control how the firmware 150 will respond to errors. The particular implementation of how the firmware implements such control can vary and is not to be limited by the examples provided herein.

Figure 5:
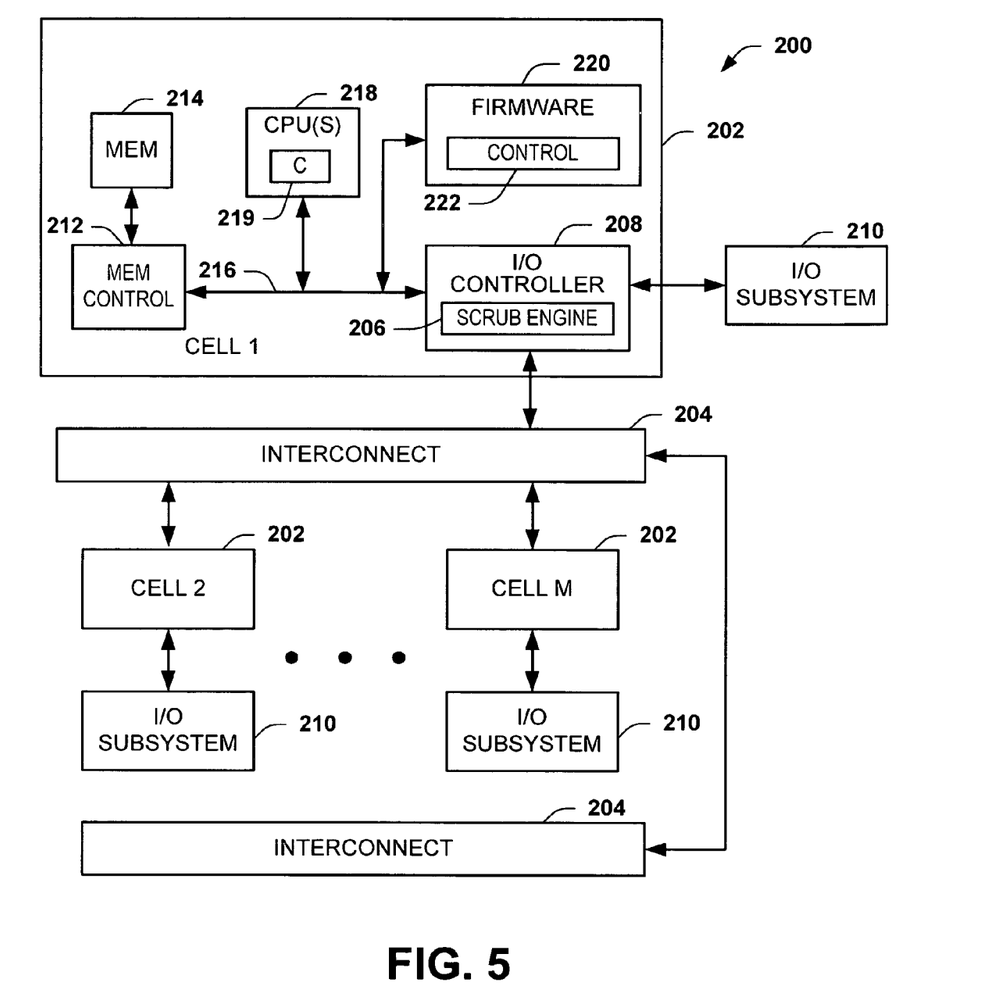
FIG. 5 depicts an embodiment of a multi-processor computer system employing hardware based memory scrubbing.

FIG. 5 depicts a block diagram illustrating an example of a computer system 200, which can implement hardware based memory scrubbing, such as including systems and components shown and described herein (e.g., FIGS. 1-4). The computer system 200 of FIG. 5 is depicted as a distributed-memory multi-processor system, although a single processor system can also implement hardware based scrubbing. The system 200 includes a plurality of cells 202 indicated respectively at CELL 1, CELL 2 through CELL M, where M is an integer greater than or equal to one denoting the number of cells. Each of the cells 202, which can be implemented as a cell board, is communicatively coupled to other cells via an interconnect 204, such as a backplane or crossbar structure. The interconnects 204 can be implemented as an application specific integrated circuit (ASIC).

In the example, of FIG. 5, a scrub engine 206 can be implemented as hardware in each cell 202, such as to implement proactive scrubbing of associated memory that is implemented in each cell. Those skilled in the art will understand and appreciate that any number of one or more scrub engines can be implemented as hardware within each cell. Alternatively, a given scrub engine may be able to service main memory in more than one cell. As an example, the scrub engine 206 can be implemented within an IC that comprises the I/O controller 208 for each cell.

By way of further example, an I/O (input/output) subsystem 210 is associated with each of the cells 202. The I/O subsystem 210 can provide an interface or pathway for accessing an associated bus structure (e.g., a PCI bus structure) or other devices coupled to the corresponding bus structure, such as through corresponding adapter (not shown). Those skilled in the art will understand and appreciate various types of I/O devices that can be accessed or can access memory in the computer system 200 via the I/O subsystem 210. The I/O controller routes requests and responses relative to such I/O devices via the I/O subsystem 210.

For purposes of brevity, the internal contents are shown only for CELL 1, although those skilled in the art will understand and appreciate that each of the other respective cells 202 can be implemented in a similar manner. Alternatively, different configurations could also be implemented relative to the different cells 202.

Turning to the contents of CELL 1, CELL 1 includes the I/O controller 208. The I/O controller is coupled to a cell memory subsystem that includes a memory controller 212 and associated main memory 214. The memory 214 can include any number of one or more memory modules, including one or more DIMM or SIMM memory devices. A cell control/interface structure, schematically indicated at 216, can be employed to facilitate intra cell communication, including intelligent buffering of requests and responses between the memory subsystem 212 and the I/O controller 208.

One or more central processing units (CPUs) 218 are also connected to the control/interface structure 216 for accessing the memory 214. Each of the CPUs 218 can include an associated cache 219 for storing data for local access by the CPU without requiring access to the memory 214. In the arrangement shown in FIG. 8, the I/O subsystem 206 (and devices coupled to the I/O subsystem) and the scrub engine 206 and the CPU(s) 218 each can be considered memory accessing devices operative to access data in the memory 214 via the control/interface structure and the controller 212. The cell 202 also includes firmware 220 that is a combination of software and hardware for controlling reading and execution of software. The firmware 220 also includes control component 222 programmed to control and manage the scrub engine 206, which control may vary depending on an operating mode of the cell 202, such as described herein.

Figure 6:
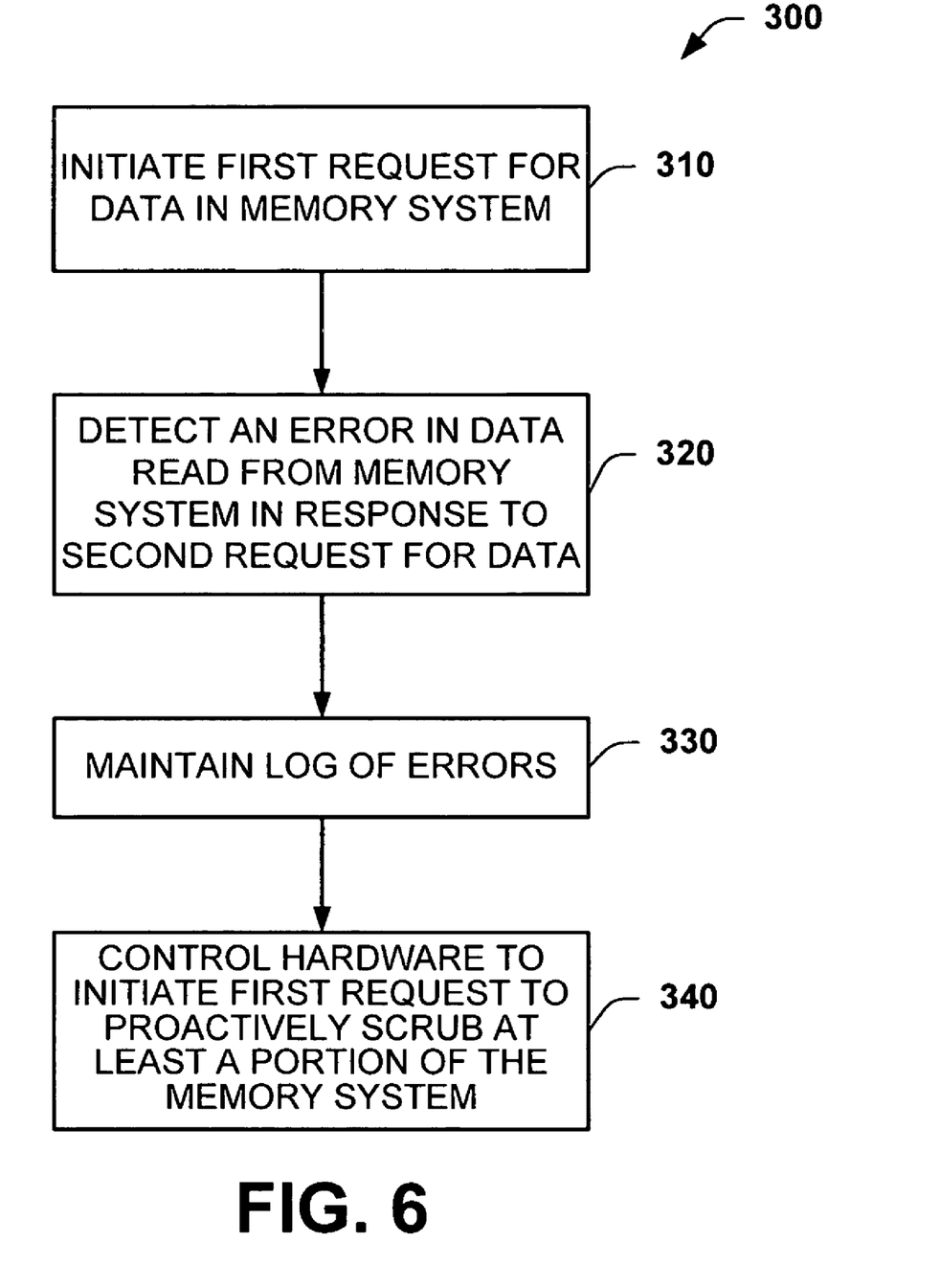
FIG. 6 is a flow diagram depicting an embodiment of a hardware based for scrubbing method.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., logic circuitry, such as including an arrangement of registers and digital logic, an application specific integrated circuit), software (e.g., as executable instructions running as firmware on a microcontroller or processor), or any combination of hardware and software.

FIG. 6 depicts an example of a method 300. The method 300 includes initiating from hardware a first request for data stored in memory system, as shown at 310. The first request includes an agent identifier that identifies the hardware that initiated the first request. The method 300 also includes detecting an error in data that has been read from the memory system in response to a second request for data, as shown at 320. The second request is one of the same or different from the first request and the detecting being performed by error detection circuitry that is operably coupled with or part of the hardware. At 330, a log of errors that are detected by the error detection circuitry is maintained. At 340, the hardware is controlled to initiate the first request to proactively scrub at least a portion of the memory system, the agent identifier enabling a differentiation between errors detected in response to the first request and other errors.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A computer system, comprising:
   a memory system that stores lines of data in at least one memory module;
   a controller operably coupled with the memory system, the controller comprising:
      an error system configured to detect errors in data that has been read from the memory system in response to a first request for the data, the error system maintaining a log of errors detected by the error system, each entry in the log of errors including an identifier that identifies the agent that initiated the request that resulted in each of the errors;
      a scrub engine configured to initiate a second request for data residing in the memory system, the second request including an agent identifier that identifies the second request as being initiated by the scrub engine, the second request being one of the same or different from the first request; and
   firmware that controls the scrub engine to test and initialize at least a portion of the memory system during a first operating mode, the firmware controlling the scrub engine to initiate the second request to the memory system for proactively scrubbing at least a portion of the memory system during a second operating mode, the firmware employing the identifier from each entry in the log of errors to differentiate between errors resulting from requests initiated by the scrub engine and errors resulting from requests initiated by other agents.

2. The computer system of claim 1, wherein the scrub engine further comprises:
   a mode register having a value that defines an operating mode for the scrub engine; and
   a memory range register that defines a range of memory addresses in the memory system, the scrub engine initiating the second requests for data in the memory system according to the range of memory addresses in the memory range register, the firmware being programmed to set the mode register and the memory range register.

3. The computer system of claim 2, wherein the scrub engine further comprises test and initialization circuitry employed during the first operating mode to test and initialize the memory system based on the range of memory addresses in the memory range register.

4. The computer system of claim 3, further comprising a pseudorandom number generator, the scrub engine controlling the pseudorandom number generator to generate at least one pseudorandom value that is written to and read from the memory system so that the error system detects errors in the memory system based on the range of memory addresses in the memory range register.

5. The computer system of claim 1, wherein the firmware further comprises a deallocation engine operative to update a data structure that is used in the computer system to deallocate portions of the memory system according to errors detected in response to the second requests initiated by the scrub engine.

6. The system of claim 1, wherein the controller defines an input/output controller that operates in a coherency domain of the computer system, the input/output controller being operably coupled with the memory system and at least one processor, the scrub engine being a direct memory access engine such that the second requests initiated by the scrub engine can be provided to the memory system and to cache of the at least one processor.

7. The system of claim 1, wherein the error log further comprises a data structure for each of the entries in the log, the data structure for each of the entries comprising:
   a first field that identifies a given agent that initiated a given request that resulted in a corresponding error being entered into the log; and
   a second field that identifies a type of the corresponding error.

8. A computer system, comprising:
   a memory system that stores lines of data in at least one memory module;
   a controller operably coupled with the memory system, the controller comprising:
      an error system configured to detect errors in data that has been read from the memory system in response to a first request for the data, the error system maintaining a log of errors detected by the error system;
      a scrub engine configured to initiate a second request for data residing in the memory system, the second request including an agent identifier that identifies the second request as being initiated by the scrub engine, the second request being one of the same or different from the first request; and firmware that controls the scrub engine to test and initialize at least a portion of the memory system during a first operating mode, the firmware controlling the scrub engine to initiate the second request to the memory system for proactively scrubbing at least a portion of the memory system during a second operating mode, wherein the firmware implements error handling control that can vary for a given error that is detected during the second operating mode according to the agent identifier and a type of the given error, the agent identifier enabling the firmware to uniquely identify errors resulting from the second requests initiated by the scrub engine such that the error handling control selectively modifies a data structure based on an error history that is maintained based on the error handling control collecting data from the log of errors.

9. The system of claim 8, wherein the data structure comprises a deallocation table that identifies at least a portion of the memory system to deallocate from the computer system.

10. A computer system, comprising:
means for detecting errors in data that has been read from non-volatile data storage means in response to requests for data;
means for maintaining a log of errors for the non-volatile data storage means that are detected by the means for detecting;
means for initiating a request for data, the request for the data including an agent identifier that identifies the request as being initiated by the means for initiating each entry in the log of errors including an agent identifier that identifies the request as being initiated by the means for initiating;
means for controlling the means for initiating a request to test and initialize at least a portion of the non-volatile data storage means during a first operating mode; and
means for controlling the means for initiating a request to initiate requests for data in the non-volatile data storage means to proactively scrub at least a portion of the non-volatile data storage means during a second operating mode.

11. The computer system of claim 10, further comprising means for differentiating between errors that result from requests initiated by the means for initiating a request and errors resulting from requests initiated by other means based on the agent identifier in each entry of the log of errors.

12. The computer system of claim 10, further comprising:
means for controlling an operating mode of the means for initiating a request; and
means for controlling a range of addresses in the non-volatile data storage means to which the means for initiating a request sends requests.

13. The computer system of claim 10, further comprising means for generating at least one pseudorandom number value that is written to and read from the non-volatile data storage means so that the means for detecting can detect errors in the non-volatile data storage means during the first operating mode.

14. A computer system comprising:
a controller of the computer system configured to proactively scrub main memory of the computer system by initiating scrub requests to the main memory,
a unique identifier being stored for each entry in a log of errors associated with errors in the main memory detected in response to the scrub requests, and
firmware of the computer system differentiating between the errors in the main memory detected in response to the scrub requests and other errors in the main memory in response to requests from other agents in the computer system based on the unique identifier stored for each entry in the log of errors.

15. A method, comprising:
initiating from hardware a first request for data stored in memory system, the first request including an agent identifier that identifies the hardware that initiated the first request;
detecting an error in data that has been read from the memory system in response to a second request for data, the second request being one of the same or different from the first request, the detecting being performed by error detection circuitry that is operably coupled with or part of the hardware;
maintaining a log of errors that are detected by the error detection circuitry;
controlling the hardware to initiate the first request to proactively scrub at least a portion of the memory system, the agent identifier enabling a differentiation between errors detected in response to the first request and other errors such that the hardware selectively modifies a data structure based on the log of errors.

16. The method of claim 15, further comprising controlling the hardware to initiate the first request to test and initialize at least a portion of the memory system during a first operating mode, the hardware being controlled to initiate the first request to proactively scrub at least a portion of the memory system during a second operating mode according to a scrub cycle, firmware controlling the operating mode and the scrub cycle.

17. The method of claim 16, further comprising generating at least one pseudorandom number value from a circuit that is operably coupled with or part of the hardware, the at least one pseudorandom number value being written to and read from the memory system for testing and initializing the memory system during the first operating mode.

* * * * *